(12) United States Patent
Kim et al.

(10) Patent No.: US 10,930,592 B2
(45) Date of Patent: Feb. 23, 2021

(54) WAFER LEVEL FAN-OUT APPLICATION SPECIFIC INTEGRATED CIRCUIT BRIDGE MEMORY STACK

(71) Applicant: Google LLC, Mountain View, CA (US)

(72) Inventors: Nam Hoon Kim, San Jose, CA (US); Woon Seong Kwon, Cupertino, CA (US); Teckgyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/405,304

(22) Filed: May 7, 2019

(65) Prior Publication Data
US 2020/0357743 A1 Nov. 12, 2020

(51) Int. Cl.
*H01L 23/528* (2006.01)
*H01L 23/00* (2006.01)
(Continued)

(52) U.S. Cl.
CPC ........ *H01L 23/5283* (2013.01); *H01L 21/561* (2013.01); *H01L 21/565* (2013.01);
(Continued)

(58) Field of Classification Search
CPC . H01L 21/561; H01L 21/565; H01L 23/3128; H01L 23/481; H01L 23/5283;
(Continued)

(56) References Cited

U.S. PATENT DOCUMENTS 7,151,010 B2 12/2006 Nguyen et al.
8,604,603 B2 12/2013 Lau et al.
2004/0178488 A1* 9/2004 Bolken .................. H01L 24/13
  257/686
2007/0246813 A1* 10/2007 Ong ...................... H01L 25/105
  257/686
(Continued)

FOREIGN PATENT DOCUMENTS

DE 10142116 11/2002
KR 101942745 1/2019
TW 201916197 4/2019

OTHER PUBLICATIONS

Garrou, Philip, et al. "RDL: an integral part of today's advanced packaging technologies" SolidState Technologies. 2011. https://electroiq.com/2011/05/rdl-an-integral-part-or-today-s-advanced/.
(Continued)

*Primary Examiner* — Allan R Wilson
(74) *Attorney, Agent, or Firm* — Colby Nipper

(57) ABSTRACT

A packaged assembly and a method of producing the packaged assembly is disclosed. The packaged assembly includes a redistribution layer (RDL), an integrated circuit (IC), one or more memory modules, and an interposer comprising a plurality of vias from a list of through-silicon-vias (TSVs), through-mold-via (TMVs), and plated-through-hold-via (PTHs). In some implementations, the IC is electrically and mechanically attached to a first side of the RDL. In some implementations, the one or more memory modules and the interposer are disposed on a second side of the RDL. The packaged assembly also includes a mold having a mold material encapsulating the IC, the one or more memory modules, the interposer, and the RDL to form the packaged assembly. In some implementations, the IC is electrically conductively connected an external circuit board via a series of electrical connections between the IC, the RDL, the vias, and the external circuit board.

20 Claims, 5 Drawing Sheets

(51) Int. Cl.
*H01L 21/56* (2006.01)
*H01L 49/02* (2006.01)
*H01L 25/16* (2006.01)
*H01L 23/48* (2006.01)
*H01L 23/31* (2006.01)

(52) U.S. Cl.
CPC ........ *H01L 23/3128* (2013.01); *H01L 23/481* (2013.01); *H01L 24/17* (2013.01); *H01L 24/96* (2013.01); *H01L 25/16* (2013.01); *H01L 28/40* (2013.01); *H01L 2224/0231* (2013.01); *H01L 2224/02373* (2013.01); *H01L 2224/02379* (2013.01); *H01L 2224/02381* (2013.01); *H01L 2924/1433* (2013.01); *H01L 2924/1434* (2013.01)

(58) Field of Classification Search
CPC ........ H01L 24/17; H01L 24/96; H01L 25/16; H01L 28/40; H01L 2224/0231; H01L 2224/02373; H01L 2924/1433
See application file for complete search history.

(56) References Cited

U.S. PATENT DOCUMENTS

| | | | | |
|---|---|---|---|---|
| 2013/0099377 A1* | 4/2013 | Yu | ............ | H01L 24/97 257/737 |
| 2013/0175686 A1* | 7/2013 | Meyer | ............ | H01L 24/19 257/738 |
| 2013/0343022 A1* | 12/2013 | Hu | ............ | H01L 24/11 361/761 |
| 2015/0235991 A1* | 8/2015 | Gu | ............ | H01L 24/17 257/762 |
| 2016/0218081 A1 | 7/2016 | Kim | | |
| 2017/0062383 A1 | 3/2017 | Yee et al. | | |

OTHER PUBLICATIONS

"International Search Report and Written Opinion", PCT Application No. PCT/US2019/063327, dated Feb. 14, 2020, 39 pages.
"Foreign Office Action", Taiwanese Application No. 108138225, dated Jul. 31, 2020, 12 pages.

* cited by examiner

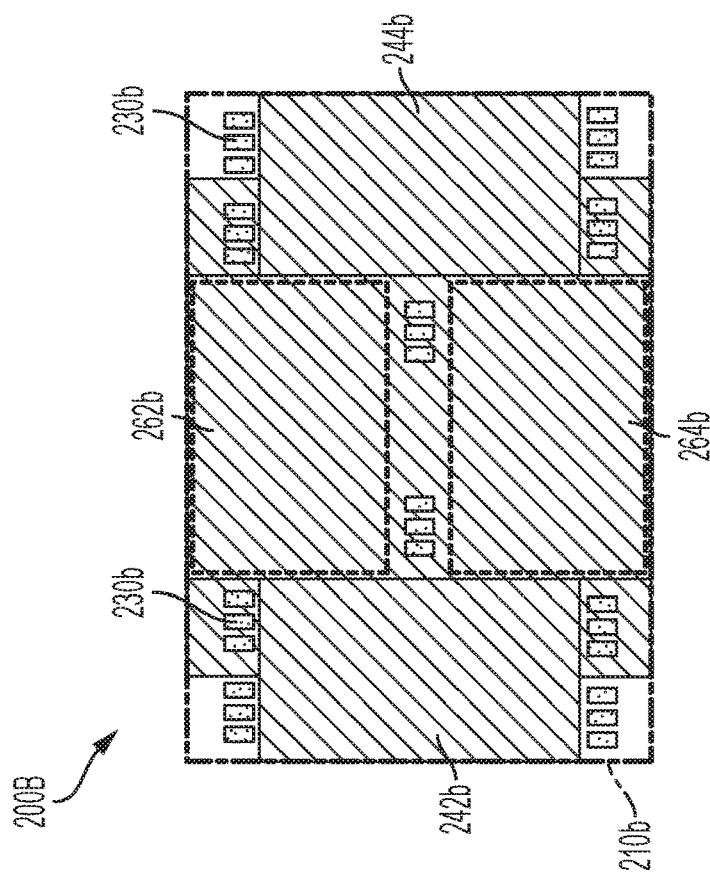
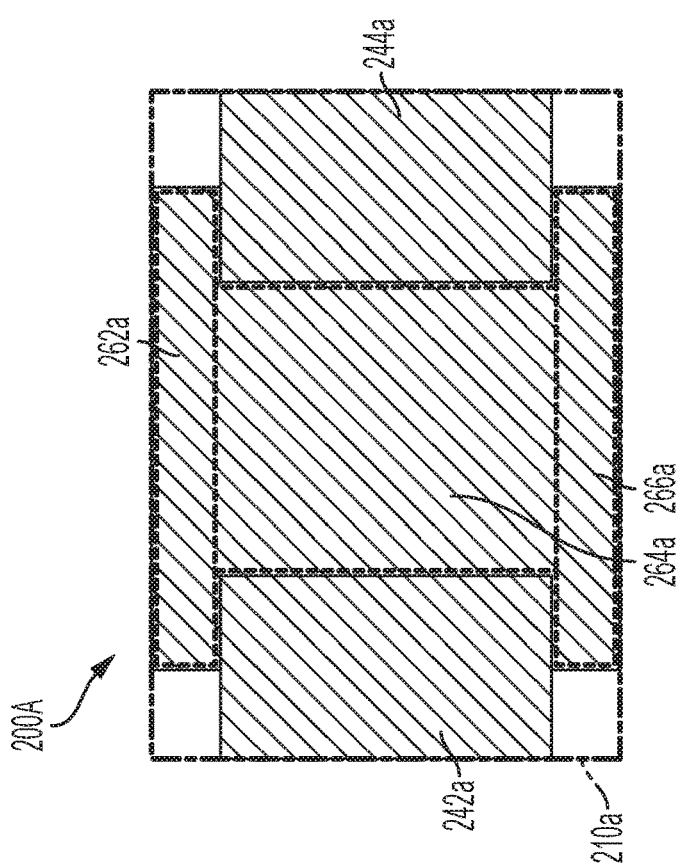
FIG. 2A
FIG. 2B

WAFER LEVEL FAN-OUT APPLICATION SPECIFIC INTEGRATED CIRCUIT BRIDGE MEMORY STACK

BACKGROUND

With rapid advancement of mobile computing systems, managing power consumption and thermal budget of such systems becomes more challenging due to the demand in performance improvements. The packaging industry is working to find a solution for next generation high performance mobile integrated circuits (IC), such as ASICs.

A conventional mobile ASIC package, for example, typically has a memory module disposed within the ASIC package. Because of the package size requirement, for example, dynamic random access memory (DRAM) modules are typically stacked on top of the ASIC. The arrangement of the DRAM on top of the ASIC provides a small footprint and an improvement over earlier configurations in terms of maintaining a decent package-size, but it is not without its limitations. For example, with the configuration of DRAM stacked on top of the ASIC, the ASIC cannot be pushed to its performance limits without overheating from its power output, because it does not have an exposed surface for cooling. Therefore, an innovative approach is needed to solve the thermal-power balance without sacrificing the increase in performance.

SUMMARY

At least one aspect is directed to a packaged assembly. The packaged assembly includes a redistribution layer (RDL) and a processor electrically and mechanically coupled to a first side of the RDL. The packaged assembly also includes an interposer electrically and mechanically coupled to a second side of the RDL, opposite the first side. The packaged assembly also includes an integrated circuit die electrically and mechanically coupled to the second side of the RDL. The packaged assembly also includes a plurality of package balls coupled to a side of the interposer opposite the RDL for electrically and mechanically coupling the packaged assembly to an external circuit board.

In some implementations, the package assembly also includes the external circuit board electrically and mechanically coupled to the package balls. In some implementations, the processor is electrically connected the external circuit board via the RDL, the interposer, and the plurality of package balls. In some implementations, the interposer includes a plurality of vias from a list of through-silicon-vias (TSVs), through-mold-via (TMVs), and plated-through-hold-via (PTHs), and the electrical connection to the external circuit board is through the vias. In some implementations, the processor includes an application specific integrated circuit (ASIC). In some implementations, the integrated circuit die includes a memory module.

In some implementations, the packaged assembly includes a mold material encapsulating the interposer, the RDL, and a portion of the processor, leaving a surface of the processor at least substantially free of the mold material. In some implementations, the integrated circuit die is disposed adjacent to the interposer, without overlapping the interposer.

At least one aspect is directed to a method of producing a packaged assembly. The method includes coupling a processor to a first side of a redistribution layer (RDL), coupling an interposer to a second side, opposite the first side, of the RDL, coupling an integrated circuit die to the second side of the RDL, and coupling a plurality of package balls to a side of the interposer opposite to RDL.

In some implementations, the method includes at least partially encapsulating the processor in a mold material, such that a surface of the processor opposite the RDL is at least substantially free of mold material. In some implementations, the method further includes at least partially encapsulating the interposer and the integrated circuit die in a mold material.

In some implementations of the method, the processor includes an application specific integrated circuit. In some implementations of the method, the integrated circuit die includes a memory module. In some implementations the method, the RDL provides an electrical connection between the integrated circuit die and the processor.

In some implementations of the method, the RDL, the interposer, and the package balls provide an electrical connection between the processor and an external circuit board.

In some implementations, the method further includes coupling the interposer to an external circuit board via the package balls.

In some implementations of the method, the integrated circuit die is coupled to the RDL laterally adjacent to, and not overlapping, the interposer.

In some implementations, the method further includes coupling additional integrated circuit die to the second side of the RDL laterally adjacent to and not overlapping the integrated circuit die or the interposer.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings:

FIG. 2A shows a bottom view of an implementation of a packaged assembly, according to an illustrative implementation;

FIG. 2B shows a bottom view of another implementation of a packaged assembly, according to an illustrative implementation;

DETAILED DESCRIPTION

Figure 1:
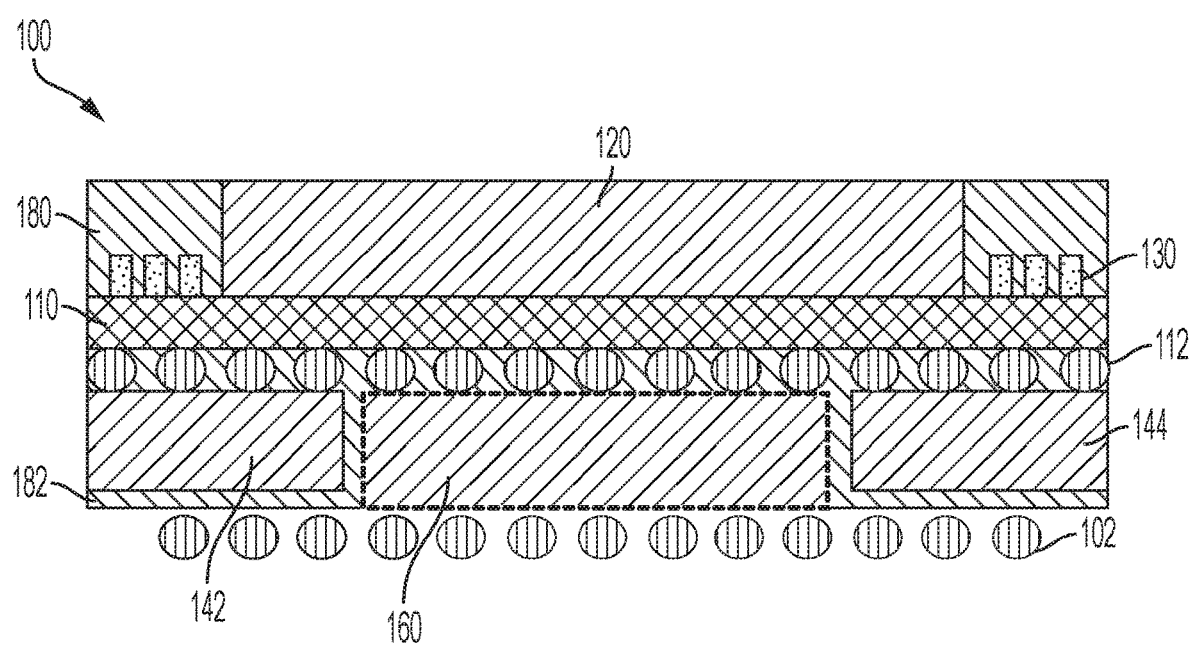
FIG. 1 shows a cross-sectional view of an implementation of a packaged assembly, according to an illustrative implementation.

The disclosure as described herein relates to various implementations of a packaged assembly having a configuration suitable for improving the thermal-power balance without sacrificing the power consumption and performance of an integrated circuit (IC), and a method for producing the packaged assembly configuration.

As discussed above, the demand for an increase in IC (e.g., Application Specific Integrated Circuits or ASICs) power and performance, necessitates revisiting thermal management systems used to manage the temperatures of such devices to better accommodate higher power consumption of such ICs. The current strategy for thermal management for a packaged assembly based on the DRAM-on-ASIC configuration needs to be improved at the package level design configuration. Since the DRAM-on-ASIC configuration does not offer an exposed surface for the ASIC, there is no active cooling mechanism that can dissipate a higher amount of heat generated by the ASIC running at the higher power necessary to produce higher performance.

There are currently existing approaches to increasing the power and performance of an IC while having a modest amount of thermal-power balance. Some of the approaches include the Package on Package (PoP) configuration, Package on Package-Molded Embedded Package (PoP-MEP) configuration, and the Hybrid Die Stack (HDS) configuration. However, these configurations tend to have a poor thermal performance for a given ASIC in a small/medium sized package. In addition, the signal integrity and power integrity of ASIC packages based on these configurations also appear to be poor. For mobile applications, such as for a cellular phone, or a tablet, a configuration, such as Integrated Fan-Out package on package (InFO PoP) configuration is widely used. Just like the aforementioned three configurations, the InFO PoP also appears to have a poor thermal performance for a given ASIC in a small/medium sized package. The signal integrity and power integrity of a mobile IC package based on this configuration also appears to be poor.

The poor thermal performance of the aforementioned four configurations is likely due to the configuration having the ASIC disposed on the bottom of the package assembly and the DRAM stacked on top of the ASIC. And since there is no available exposed surface for the ASIC to dissipate the generated heat due to the DRAM being on top, the power consumption, and hence performance, is lowered to avoid overheating the ASIC.

A more advanced packaging technology currently available is based on Panel Level Packaging (PLP-m) technology, which uses a fine redistribution layer (RDL) and bonding to improve the ASIC performance. In this configuration, the ASIC and memory are placed side-by-side so that the ASIC has an exposed surface area to dissipate heat. The thermal management for this configuration is more straightforward because the ASIC does not need to be throttled, and therefore, can be configured to run at maximum speed and performance. However, due to the lateral side-by-side placement of the ASIC and memory modules, the package size is dramatically increased. For example, the typical 15 mm×15 mm package size that is used for traditional configurations, such as PoP, PoP-MEP, and HDS, need to be larger for PLP-m, up to, e.g., a package size of about 19 mm×13 mm, to include one DRAM (DRAM size ~5.3 mm×3.2 mm) and will grow to 24 mm×13 mm to include two DRAMs. The increase in the size of the package is not advantageous, particular for a multi-package (MCP) configuration, where an increase of a few mm in an individual package size would increase significantly for the MCP configuration.

The configuration described herein offers a packaged assembly that can produce comparable performance and thermal management to the PLP-m configuration, while maintaining the package size close to the standard 15 mm×15 mm. The disclosed packaged assembly configuration does not require any new manufacturing processes and thus can be produced with existing fabrication technology.

Various implementations of a packaged assembly disclosed herein include a redistribution layer (RDL), an integrated circuit (IC), one or more memory modules, and an interposer. As described herein, according to some implementations, the IC is electrically and mechanically attached to a first side of the RDL. In some implementations, the one or more memory modules and the interposer are disposed on a second side of the RDL. In various implementations, the packaged assembly also includes a mold material for encapsulating the IC, the one or more memory modules, the interposer, and the RDL to form the packaged assembly. In some implementations, the mold material includes an epoxy resin.

As described herein, in some implementations of the packaged assembly, the RDL includes a plurality of metal layers, separated by layers of dielectric materials, to allow for a more spatially distributed set of electrical connections between the IC and other electrical components within the packaged assembly. The RDL has a plurality of contact pads for bonding to bump bonds (e.g., solder or gold bumps or balls) coupled to the underside of the IC, thereby mechanically and electrically coupling the IC to the first side of the RDL. In some other implementations, the IC may be coupled to the RDL via surface-mounting techniques, using solder paste or other suitable conductive bond, rather than the use of bump bonds. In some implementations, the RDL also includes a plurality of contact pads for bonding to bump bonds (e.g., solder or gold bumps or balls) coupled to the memory modules and/or the interposer, thereby mechanically and electrically coupling the memory and interposer to the second side of the RDL. In some implementations, the memory modules and/or the interposer are surface-mounted to the RDL using a solder paste or other conductive paste or glue. In some implementations, the one or more memory modules and the interposer are laid out across the second side of the RDL so that the one or more memory modules and the interposer are not stacked on top of another.

In various implementations, the interposer includes a plurality of vias from a list of, for example, but not limited to through-silicon-vias (TSVs), through-mold-via (TMVs), and plated-through-hold-via (PTHs). In some implementations, the vias are configured to provide electrical connections between the IC and an external circuit board. In some implementations, the vias include, or have a coating that includes, for example, at least one of copper, aluminum or gold.

In some implementations, the packaged assembly also includes a plurality of solder balls, for example in a ball grid array (BGA) for providing mechanical and electrical connections between the packaged assembly and an external circuit board, such as a printed circuit board. In some implementations, the IC has an exposed surface that is substantially free of the mold material to allow cooling of the IC.

In some implementations, the one or more memory modules include one of random access memory (RAM), static RAM, dynamic RAM (DRAM), synchronous dynamic RAM, or double data rate RAM (DDR RAM), including DDR2 RAM, DDR4 RAM and DDR4 RAM, low-power DDR (LPDDR), GDDR, DBM (Data Boost Memory) or future memory or ASIC.

The following figures and descriptions with respect to the figures provide additional details of the various implementations of the packaged assembly and the method for producing the same.

FIG. 1 shows a cross-sectional view of an implementation of a packaged assembly 100, according to an illustrative implementation. The packaged assembly 100 includes a redistribution layer (RDL) 110, an integrated circuit (IC) 120, a plurality of passive electrical components 130 (e.g., capacitors, resistors, diodes, etc.), memory modules or another ASIC 142 and 144, and an interposer 160. As shown in FIG. 1, the IC 120 is disposed on top of the RDL 110. The IC 120 is disposed on a top side (a first side) of the RDL 110. The IC 120 can be electrically conductively connected to the RDL 110 via a plurality of bump bonds (not shown) or any suitable electrical connection, such as a solder paste. The IC 120 can be a processor, such as an ASIC, a FGPA, a microprocessor, a DSP, a graphics processing unit (GPU), tensor processing unit (CPU) or any other type of high-performance integrated circuit that would benefit from the additional heat dissipation characteristics of the packaged assembly disclosed herein. While only a single IC 120 is shown on the top side of the RDL 110 in FIG. 1, it should be understood that in some implementations, multiple ICs 120, e.g., multiple processor cores, may be arrayed side by side on the top-side of the RDL 110 in a single packaged assembly.

As shown in FIG. 1, the packaged assembly 100 also includes a mold 180, a mold 182, a plurality of bump bonds 112 and a plurality of package balls 102. In some implementations, the memory modules or another ASIC 142 and 144, and the interposer 160 are disposed on a bottom side (a second side) of the RDL 110. In some implementations, the memory modules 142 and 144, and the interposer 160 can be electrically conductively connected to the RDL 100 via a plurality of bump bonds 112 (e.g., solder or gold bumps or balls) or any suitable electrical connection, such as a solder paste. In some implementations, the packaged assembly 100 includes the plurality of package balls 102 for providing mechanical and electrical connections between the packaged assembly 100 and an external circuit board (not shown) or another substrate.

In some implementations, the RDL 110 is a typical redistribution layer known to those of ordinary skill in the art for spatially distributing electrical connections between components in a packaged assembly. The RDL is formed from one or more patterned metal layers separated by layers to dielectric to allow for routing of interconnects across the surface of and through the RDL 110. In some implementations, the RDL 110 includes a plurality of contact pads or other suitable contact areas for electrically and mechanically coupling to various electronic components of the packaged assembly 100. The contact pads, in some implementations are coated with one more adhesion layers to improve adhesion of solder or gold balls that, when re-melted, form the electrical and mechanical connections to the RDL 110. The contact pads can be on both sides of the RDL 110.

As shown in FIG. 1, in some implementations, the packaged assembly 100 also includes a plurality of passive electrical components 130, such as capacitors, embedded in the mold 180 near the IC 120 for better power integrity. In addition, or in the alternative, passive electrical components 130 can be disposed near the memory modules 142 or 144.

As shown in FIG. 1, the memory modules 142 and 144 are disposed on the bottom side of the RDL 100. In some implementations, the memory modules 142 and 144 are electrically conductively connected to a portion of the RDL 100 via a subset of the plurality of bump bonds 112. In some implementations, the memory modules 142 and 144 are electrically conductively connected to the IC 120 via the subset of bump bonds 112 and the RDL 110. In some implementations, the memory modules 142 and 144 can include, but are not limited to random access memory (RAM), static RAM, dynamic RAM (DRAM), synchronous dynamic RAM, and double data rate RAM (DDR RAM), including DDR2 RAM, DDR4 RAM and DDR4 RAM, low-power (LPDDR), GDDR, DBM (Data Boost Memory) or future memory or ASIC.

As shown in FIG. 1, the interposer 160 is disposed on the bottom side of the RDL 110. In some implementations, the interposer 160 includes a plurality of vias from a list of, for example, but not limited to through-silicon-vias (TSVs), through-mold-via (TMVs), and plated-through-hold-via (PTHs). In some implementations, the interposer 160 is electrically conductively connected to a portion of the RDL 100 via a subset of the bump bonds 112. In some implementations, the interposer 160 is electrically conductively connected to the IC 120 via the subset of bump bonds 112 and the RDL 110.

In some implementations, the vias in the interposer 160 are configured to provide electrical connections between the IC 120 and an external circuit board (not shown), such as a printed circuit board. In some implementations, the vias in the interposer 160 can include, or have a coating that includes, for example, at least one of copper, aluminum or gold.

In some implementations, the interposer 160 is electrically conductively connected to the external circuit board via the plurality of package balls 102. The package balls may be solder balls, gold balls, or balls or other reflowable conductive material suitable for coupling a package assembly to an external circuit board. In some implementations, the IC 120 can be electrically conductively connected to the external circuit board via a series of electrical connections between the IC 120, the RDL 110, the plurality of bump bonds 112, the vias, and the plurality of package balls 102.

As shown in FIG. 1, according to some implementations, the packaged assembly 100 includes the mold 180, which encapsulates the IC 120 and the plurality of capacitors 130. Also shown in FIG. 1, the packaged assembly 100 also includes the mold 182, which encapsulates the memory modules 142 and 144 and the interposer 160. The molds 180 and 182 can be formed from any suitable mold material, such as an epoxy resin.

As shown in FIG. 1, the IC 120 has an exposed surface which is completely free, or substantially free of the mold material. As used herein, and in various implementations, the surface of the IC 120 is considered substantially free of the mold material if the surface is at least 99%, about 98%, about 95%, about 90%, or about 80% free of the mold material. The exposed surface facilitates dissipation of heat generated by the IC 120. In some implementations, a heat sink, evaporative cooling element, or an active cooling elements (such as a thermoelectric cooler) is coupled to the exposed surface of the IC 120 to further facilitate heat management.

FIG. 2A shows a bottom view of an example implementation of a packaged assembly 200A, according to an illustrative implementation. As used herein, a bottom view of the packaged assembly refers to a view of the packaged assembly that would face an external circuit board to which the packaged assembly is configured to be coupled. As shown in FIG. 2A, the packaged assembly 200A includes dies 242a and 244a, interposer 264a, and passive component regions 262a and 266a disposed on a RDL 210a. In some implementations, the components 242a, 244a, 262a, 264a, and 266a are laid out across the RDL 210a without overlapping one another (i.e., without being stacked on top of another).

In some implementations, the dies 242a and 244a are memory modules, such as the memory modules 142 and 144 as shown and described with respect to FIG. 1, and therefore, will not be described in further detail. In some implementations, the dies 242a and 244a are each another type of integrated circuit, preferably with relatively low power dissipation requirements, lower performance ASICs. In some implementations, the passive component regions 262a and 266a include passive electronic components such as capacitors, to smooth out variations in current supply or voltage due to time-varying power demands of the active components within the packaged assembly 200A. In alternative implementations, the passive component regions 262a and 266a instead serve as locations for smaller integrated circuit components. In some implementations, the interposer 264a is similar to the interposer 160 shown and described with respect to FIG. 1.

FIG. 2B shows a bottom view of another example implementation of a packaged assembly 200B, according to an illustrative implementation. As shown in FIG. 2B, the packaged assembly 200B includes dies 242b and 244b, a plurality of passive electronic components 230b (e.g., capacitors), laterally arranged on an RDL 210b. The packaged assembly 200B also includes two interposers 262b and 264b. The components 242b, 244b, 262b, 264b, and 230b are laid out across the RDL 210b without being stacked on top of another.

In some implementations, the dies 242b and 244b are memory modules, such as the memory modules 142 and 144. In some implementations, one or both of the dies 242b and 244b are other types of integrated circuits, besides memory modules, such as lower powered ASICs with lower heat dissipation requirements than the ASIC coupled to the top side of the RDL. In some implementations, the interposers 262b and 264b are each substantially similar to the interposer 160 shown in FIG. 1.

Various alternative layouts of interposers, integrated circuit dies, and passive components can also be employed on the bottom side of the packaged assembly without departing from the scope of this disclosure.

Figure 3A:
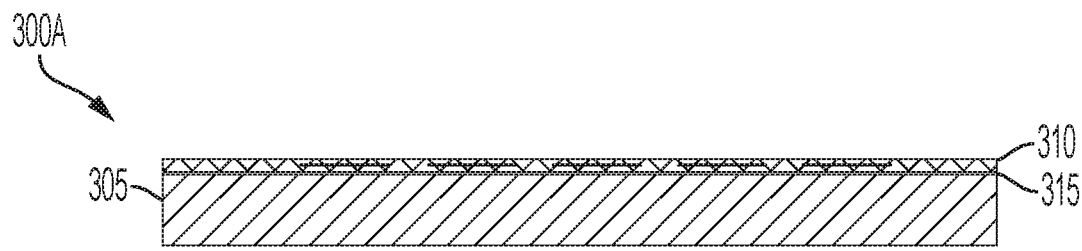
FIGS. 3A-3H show schematic illustrations of a process flow for producing a packaged assembly.

FIGS. 3A-3H show schematic illustrations of a process flow for producing a packaged assembly. The process flow shown in FIGS. 3A-3H illustrates progression in the production of the packaged assembly at stages 300A, 300B, 300C, 300D, 300E, 300F, 300G, and 300H. For example, stage 300A shown in FIG. 3A shows a RDL 310 attached to a carrier wafer 305 via a release layer 315. In some implementations, the RDL 310 is similar or substantially similar to the RDL 100 as shown and described with respect to FIG. 1. In some implementations, the carrier wafer 305 can be a silicon substrate or any suitable wafer that can be used as a carrier substrate. In some implementations, the release layer 315 can be any suitable release layer known in the art of semiconductor fabrication.

Figure 3B:
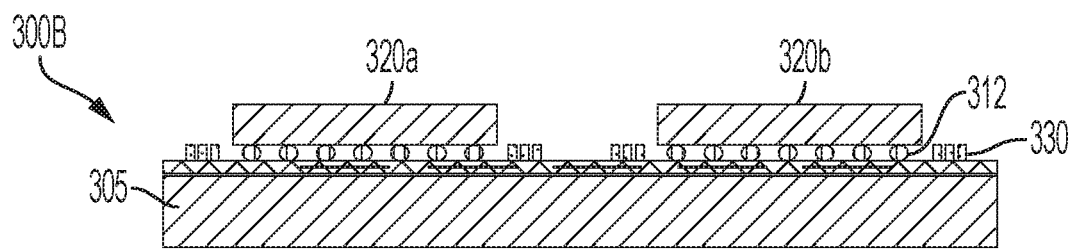

As shown in FIG. 3B, stage 300B illustrates ICs 320a and 320b disposed on a first side (on top) of the RDL 310. Stage 300B also shows a plurality of passive electrical components 330 (in this case capacitors) disposed near the ICs 320a and 320b. In some implementations, the plurality of capacitors are placed near the ICs 320a and 320b to provide power integrity (e.g., to smooth out variations in current supply in response to the time varying current draws of the IC). In some implementations, the plurality of bump bonds 312 are first disposed on the ICs 320a and 320b, and the ICs 320a and 320b are flip-chip bonded to the RDL 310.

Figure 3C:
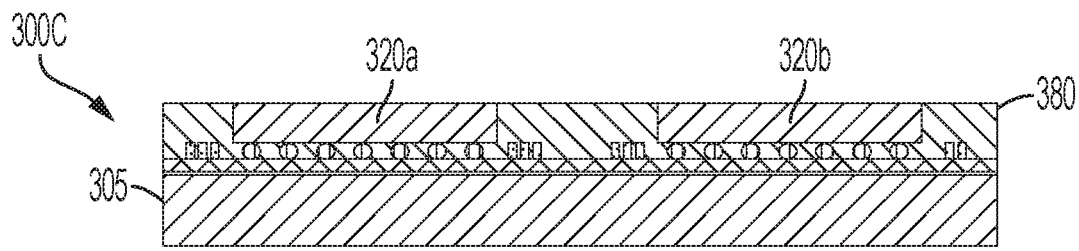

Stage 300C shown in FIG. 3C illustrates a mold 380 disposed on the first side of the RDL 310. As shown in FIG. 3B, the mold 380 includes a mold material (e.g., an epoxy resin) for encapsulating the ICs 320a and 320b, the plurality of passive electrical components 330, and the plurality of bump bonds 312. In some implementations, each of the ICs 320a and 320b has an exposed surface that is completely, or at least substantially, free of the mold material. In some implementations, each of the ICs 320a and 320b has an exposed surface about 99%, about 98%, about 95%, about 90%, about 80%, about 50% free of the mold material. In some implementations, the exposed surface of the ICs 320a and 320b facilitates dissipation of heat generated by the ICs 320a and 320b.

Figure 3D:
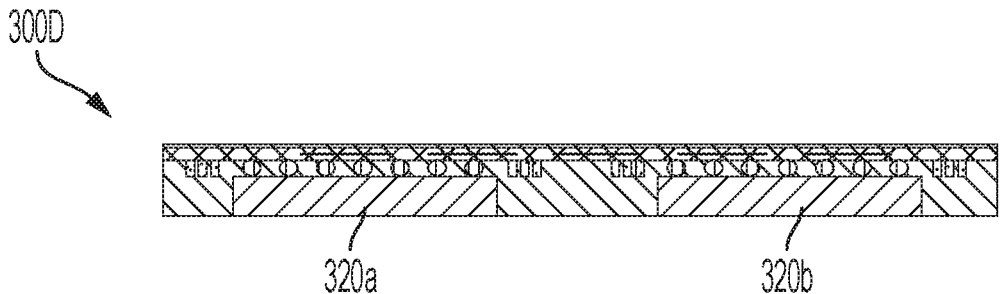

Stage 300D shown in FIG. 3D illustrates the released encapsulated ICs 320a and 320b on the RDL 310 after removal of the carrier wafer 305. In some implementations, the removal of the carrier wafer 305 occurs via a mechanical, a chemical or laser ablation method. As shown in FIG. 3D, the released encapsulated ICs 320a and 320b on the RDL 310 is obtained by removing the release layer 315. In some implementations, the removal of the release layer 315 occurs via a chemical, a vapor, a laser, a thermal, or a plasma treatment. For carrier wafers that are transparent to ultraviolet wavelengths of light, the release may be triggered by a ultraviolet light application. Note that the illustration shown in FIG. 3D is oriented up-side down relative to the structures shown in FIGS. 3A-3C to illustrate that the structure is being prepared for the next processing step. As shown in FIG. 3D, an entire second side of the RDL 310 is shown as a surface to which additional components are to be added.

Figure 3E:
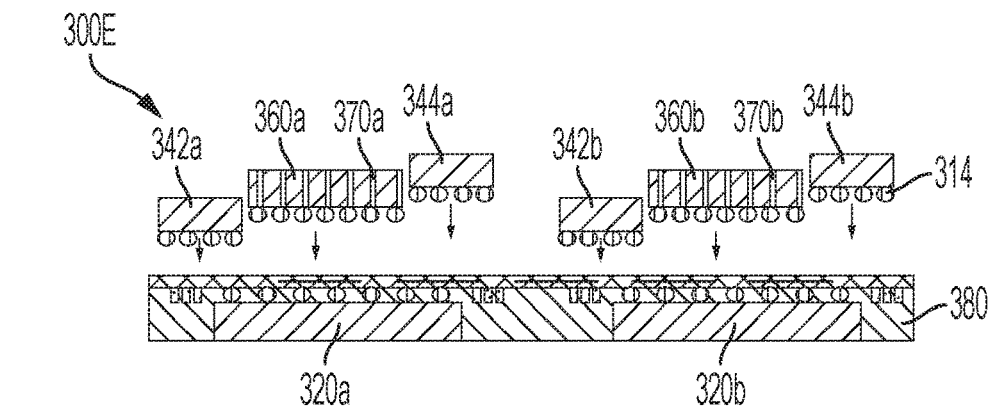

Stage 300E shown in FIG. 3E is an illustration of memory modules 342a, 344a, 342b, and 344b, and interposers 360a and 360b are being attached to the second side of the RDL 310. As shown in FIG. 3E, the memory modules 342a and 344a, and the interposer 360a are being electrically conductively attached to the second side of the RDL 310, on an opposite side of the encapsulated IC 320a. Similarly, stage 300E illustrates the memory modules 342b and 344b, and the interposer 360b being electrically conductively attached to the second side of the RDL 310, on the opposite side of the encapsulated IC 320b. In both attachments, a plurality of bump bonds 314 (e.g., solder or gold balls) are used in providing the electrical connections between the memory modules 342a, 344a, 342b, and 344b, and the interposers 360a and 360b and the RDL 310.

In some implementations, the memory modules 342a, 344a, 342b, and 344b are similar or substantially similar to the memory modules 142 and 144 as shown and described with respect to FIG. 1, and therefore, will not be described in further detail here. In some implementations, the interposers 360a and 360b are substantially similar to the interposer 160 shown and described with respect to FIG. 1.

In some implementations, the interposers 360a and 360b include a plurality of vias 370a and 370b, respectively. In some implementations, the vias 370a and 370b in the respective interposers 360a and 360b are configured to provide electrical connections between the ICs 320a and 320b and an external circuit board (shown in FIG. 3H). In some implementations, each of the vias 370a and 370b include or have a coating having at least one of, for example, copper, aluminum or gold.

Figure 3F:
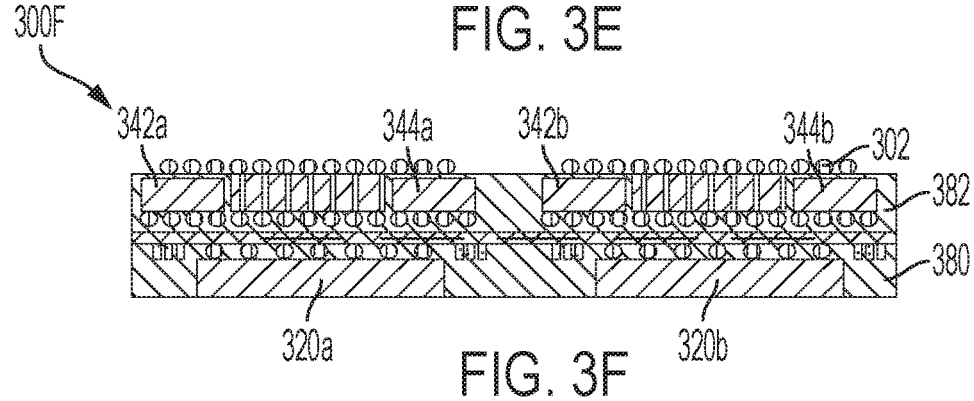

Stage 300F shown in FIG. 3F illustrates a plurality of package balls 302 and a mold 382 disposed on the second side of the RDL 310. As shown in FIG. 3B, the mold 382 includes a mold material encapsulating the memory modules 342a, 344a, 342b, and 344b, the interposers 360a and 360b, and the plurality of bump bonds 314. In some implementations, each of the interposers 360a and 360b has an exposed surface completely or substantially free of the mold material. In some implementations, each of the interposers 360a and 360b has an exposed surface about 99%, about 98%, about 95%, about 90%, about 80%, about 50% free of the mold material.

Figure 3G:
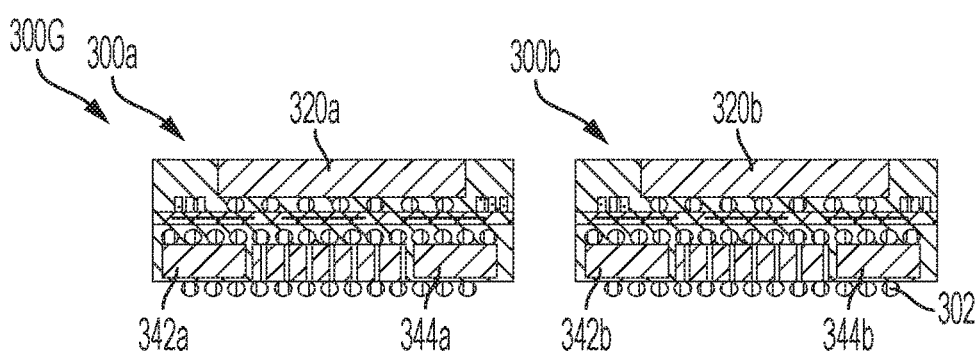

Stage 300G shown in FIG. 3G illustrates the plurality of packaged assemblies singulated to produce individual packaged assemblies 300a and 300b. As shown in FIG. 3G, the packaged assembly 300a includes the memory modules 342a and 344a, the interposer 360a, and the IC 320a, and packaged assembly 300b includes the memory modules 342b and 344b, the interposer 360b, and the IC 320b.

Figure 3H:
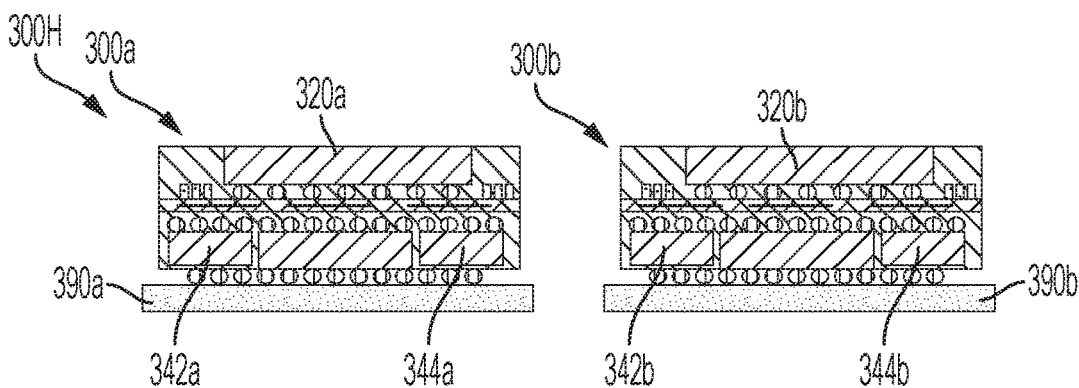

Stage 300H shown in FIG. 3H illustrates the singulated packaged assemblies 300a and 300b respectively attached to external circuit boards 390a and 390b. As shown in FIG. 3H, the packaged assembly 300a is electrically conductively attached to the external circuit board or substrate 390a via the plurality of package balls 302, and the packaged assembly 300b is electrically conductively attached to the external circuit board or substrate 390b via the plurality of package balls 302.

The various stages 300A, 300B, 300C, 300D, 300E, 300F, 300G, and 300H illustrated and described in respective FIGS. 3A-3H can be summarized in a flow chart as described below.

Figure 4:
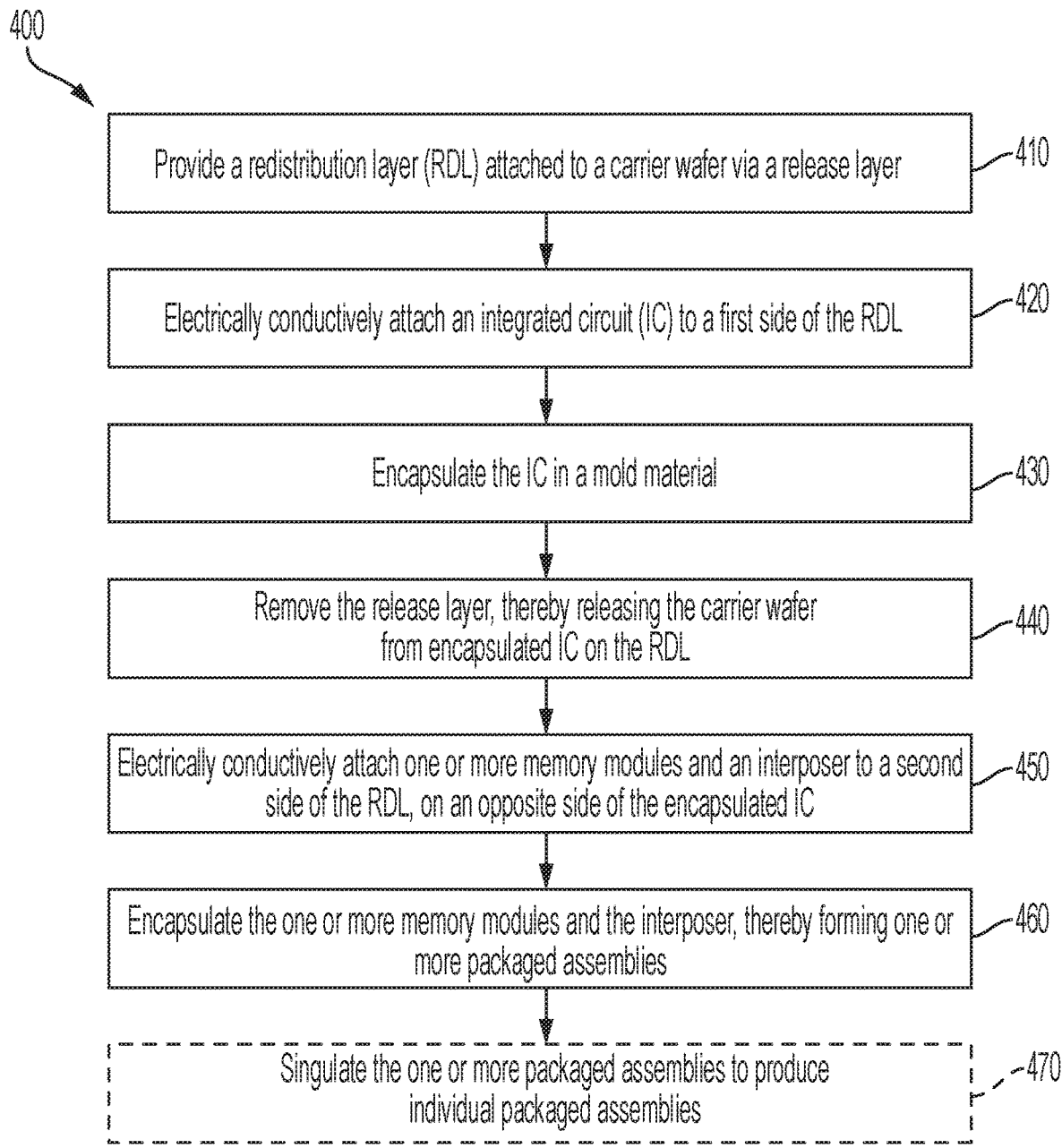
FIG. 4 is a flowchart for a method of producing a packaged assembly, according to an illustrative implementation.

FIG. 4 is a flowchart for a method 400 of producing a packaged assembly, according to an illustrative implementation. The method 400 includes providing a redistribution layer (RDL) attached to a carrier wafer via a release layer at step 410. The method 400 also includes electrically conductively attaching an integrated circuit (IC) (such as any of the processors discussed in relation to FIG. 1) to a first side of the RDL at step 420. The method 400 also includes encapsulating the IC in a mold material at step 430. The method 400 also includes removing the release layer, thereby releasing the carrier wafer from encapsulated IC on the RDL at step 440. The method 400 also includes electrically conductively attaching one or more memory modules and an interposer to a second side of the RDL, on an opposite side of the encapsulated IC at step 450. The method 400 further includes encapsulating the one or more memory modules and the interposer to form the packaged assembly at step 460. In some implementations, the method 400 includes encapsulating the one or more memory modules and the interposer to form a plurality of packaged assemblies. In some implementations, the method 400 optionally includes singulating the plurality of packaged assemblies to produce individual packaged assemblies.

In some implementations, the one or more memory modules include one of random access memory (RAM), static RAM, dynamic RAM (DRAM), synchronous dynamic RAM, or double data rate RAM (DDR RAM), including DDR2 RAM, DDR4 RAM and DDR4 RAM, LPDDR, GDDR, DBM (Data Boost Memory) or future memory or ASIC.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A packaged assembly comprising:
   a redistribution layer (RDL);
   a processor electrically and mechanically coupled to a first side of the RDL;
   an interposer electrically and mechanically coupled to a second side of the RDL, opposite the first side;
   an integrated circuit die electrically and mechanically coupled to the second side of the RDL, the integrated circuit die mechanically separated from the interposer;
   a plurality of package balls coupled to a side of the interposer opposite the RDL for electrically and mechanically coupling the packaged assembly to an external circuit board; and
   a mold material encapsulating the interposer, the RDL, and a portion of the processor, the encapsulating leaving a surface of the processor at least substantially free of the mold material.

2. The packaged assembly of claim 1, comprising the external circuit board electrically and mechanically coupled to the package balls.

3. The packaged assembly of claim 1, wherein the processor is electrically connected the external circuit board via the RDL, the interposer, and the plurality of package balls.

4. The packaged assembly of claim 3, wherein the interposer comprises a plurality of vias from a list of through-silicon-vias (TSVs), through-mold-via (TMVs), and plated-through-hold-via (PTHs), and the electrical connection to the external circuit board is through the vias.

5. The packaged assembly of claim 1, wherein the processor comprises an application specific integrated circuit (ASIC).

6. The packaged assembly of claim 1, wherein the integrated circuit die comprises a memory module.

7. The packaged assembly of claim 1, wherein the integrated circuit die is disposed adjacent to the interposer, without overlapping the interposer.

8. The packaged assembly of claim 1, further comprising passive component regions disposed on the RDL.

9. The packaged assembly of claim 8, wherein a plurality of capacitors are disposed on the RDL within the passive component regions.

10. The packaged assembly of claim 1, wherein the processor comprises a graphics processing unit (GPU).

11. The packaged assembly of claim 10, wherein the memory module includes random access memory (RAM), static RAM, or dynamic random access memory (DRAM).

12. A method comprising:
coupling a processor to a first side of a redistribution layer (RDL); coupling an interposer to a second side, opposite the first side, of the RDL;
coupling an integrated circuit die to the second side of the RDL, the integrated circuit die mechanically separated from the interposer;
coupling a plurality of package balls to a side of the interposer opposite to RDL; and
encapsulating the interposer, the RDL, and a portion of the processor in a mold material such that a surface of the processor opposite the RDL is at least substantially free of the mold material.

13. The method of claim 12, further comprising at least partially encapsulating the interposer and the integrated circuit die in a mold material.

14. The method of claim 12, wherein the processor comprises an application specific integrated circuit.

15. The method of claim 12, wherein the integrated circuit die comprises a memory module.

16. The method of claim 12, wherein the RDL provides an electrical connection between the integrated circuit die and the processor.

17. The method of claim 12, wherein the RDL, the interposer, and the package balls provide an electrical connection between the processor and an external circuit board.

18. The method of claim 12, comprising coupling the interposer to an external circuit board via the package balls.

19. The method of claim 12, wherein the integrated circuit die is coupled to the RDL laterally adjacent to, and not overlapping, the interposer.

20. The method of claim 12, comprising coupling additional integrated circuit die to the second side of the RDL laterally adjacent to and not overlapping the integrated circuit die or the interposer.

* * * * *